United States Patent
Lian et al.

(10) Patent No.: US 11,081,350 B2
(45) Date of Patent: Aug. 3, 2021

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Jian-Jou Lian, Tainan (TW); Yao-Wen Hsu, New Taipei (TW); Neng-Jye Yang, Hsinchu (TW); Li-Min Chen, Zhubei (TW); Chia-Wei Wu, Miaoli County (TW); Kuan-Lin Chen, New Taipei (TW); Kuo Bin Huang, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/686,982

(22) Filed: Nov. 18, 2019

(65) Prior Publication Data

US 2020/0083038 A1     Mar. 12, 2020

Related U.S. Application Data

(63) Continuation of application No. 15/724,031, filed on Oct. 3, 2017, now Pat. No. 10,483,108.

(Continued)

(51) Int. Cl.
| | |
|---|---|
| *H01L 21/027* | (2006.01) |
| *H01L 21/311* | (2006.01) |
| *H01L 21/02* | (2006.01) |
| *G03F 7/32* | (2006.01) |
| *G03F 7/20* | (2006.01) |
| *G03F 7/09* | (2006.01) |
| *H01L 21/033* | (2006.01) |
| *G03F 7/095* | (2006.01) |
| *H01L 21/306* | (2006.01) |

(52) U.S. Cl.
CPC ......... *H01L 21/0273* (2013.01); *G03F 7/094* (2013.01); *G03F 7/20* (2013.01); *G03F 7/32* (2013.01); *H01L 21/0228* (2013.01); *H01L 21/0332* (2013.01); *H01L 21/0337* (2013.01); *H01L 21/31111* (2013.01); *G03F 7/095* (2013.01); *H01L 21/30608* (2013.01)

(58) Field of Classification Search
CPC ........ F02M 19/04; F02M 7/17; Y10S 261/38; G03F 7/094; G03F 7/095; G03F 7/20; G03F 7/32; H01L 21/0228; H01L 21/0273; H01L 21/0332; H01L 21/0337; H01L 21/30608; H01L 21/31111
USPC ....... 438/694, 745, 750, 752, 753, 754, 762, 438/763, 756
See application file for complete search history.

(56) References Cited

U.S. PATENT DOCUMENTS

7,326,651 B2 * 2/2008 Baks ................ H01L 21/31144
                                              257/E21.579
9,466,678 B2 * 10/2016 Huang ............. H01L 21/28518
(Continued)

*Primary Examiner* — Lan Vinh
(74) *Attorney, Agent, or Firm* — Slater Matsil, LLP (57) ABSTRACT

A semiconductor device and method of manufacture are provided. After a patterning of a middle layer, the middle layer is removed. In order to reduce or prevent damage to other underlying layers exposed by the patterning of the middle layer and intervening layers, an inhibitor is included within an etching process in order to inhibit the amount of material removed from the underlying layers.

20 Claims, 6 Drawing Sheets

Related U.S. Application Data (60) Provisional application No. 62/491,759, filed on Apr. 28, 2017.

(56) References Cited

U.S. PATENT DOCUMENTS

| | | |
|---|---|---|
| 2004/0132291 A1 | 7/2004 | Lee et al. |
| 2005/0261151 A1 | 11/2005 | Lee et al. |
| 2008/0318435 A1 | 12/2008 | Mistkawi et al. |
| 2009/0032766 A1 | 2/2009 | Rajaratnam et al. |
| 2009/0131295 A1 | 5/2009 | Cui |
| 2009/0184092 A1* | 7/2009 | Takahashi ............ C09K 13/00 216/100 |
| 2009/0191711 A1* | 7/2009 | Rui ................... H01J 37/3266 438/695 |
| 2010/0164074 A1* | 7/2010 | King .................. H01L 21/0206 257/635 |
| 2011/0124195 A1 | 5/2011 | Park et al. |
| 2012/0295390 A1* | 11/2012 | Fisher ................. C09K 13/02 438/71 |
| 2013/0217234 A1 | 8/2013 | Liu et al. |
| 2015/0179510 A1* | 6/2015 | Thompson ....... H01L 21/32115 438/643 |
| 2015/0318172 A1 | 11/2015 | Huang et al. |
| 2017/0125340 A1* | 5/2017 | Tsai ................. H01L 21/02178 |
| 2018/0261562 A1* | 9/2018 | Mimuro ................ H01L 24/05 |

\* cited by examiner

SEMICONDUCTOR DEVICE AND METHOD OF MANUFACTURE

PRIORITY CLAIM AND CROSS-REFERENCE

This application is a continuation of U.S. patent application Ser. No. 15/724,031, entitled "Semiconductor Device and Method of Manufacture," filed on Oct. 3, 2017, which application claims priority to U.S. Provisional Patent Application No. 62/491,759, entitled "Semiconductor Device and Method of Manufacture," filed on Apr. 28, 2017, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below with respect to semiconductor manufacturing processes at process nodes including a 20 nm process node, a 16 nm process node, a 10 nm process node, a 7 nm process node, a 5 nm process node, or the like. However, the embodiments described may also be used in a wide variety and are not limited to these embodiments.

Figure 1:
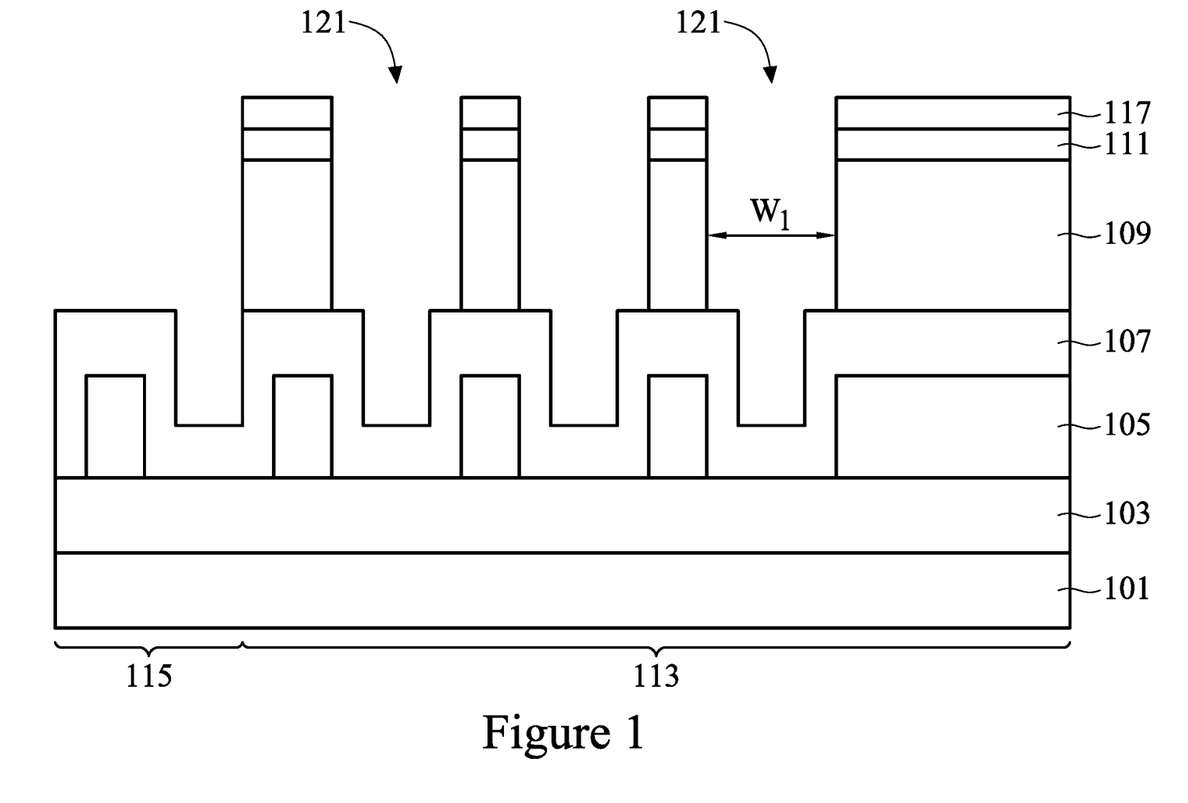
FIG. 1 illustrates a formation of an opening through a middle layer, in accordance with some embodiments.

With respect now to FIG. 1, there is illustrated an embodiment which includes a layer to be patterned 101, a first hard mask 103, a mandrel layer 105, a spacer material 107, a bottom layer 109, a middle layer 111, and a second photoresist 117. The layer to be patterned 101 may be a layer of semiconductor material, may be an upper layer of a metallization layer, may be a dielectric layer (such as a passivation layer) formed over a semiconductor substrate (not separately illustrated), or may even be another masking layer that will be utilized to pattern yet another underlying layer. In an embodiment in which the layer to be patterned 101 is a semiconductor material, the layer to be patterned 101 may be a semiconductor substrate with or without intervening active devices, metallization layers, and dielectric material.

In another embodiment in which the layer to be patterned 101 is a metallization layer, the layer to be patterned 101 may be formed of a conductive material using processes such as damascene, dual damascene, deposition and patterning, etc. In a particular embodiment the conductive material for the layer to be patterned 101 comprises at least one metal, metal alloy, metal nitride, metal sulfide, metal selenide, metal oxide, or metal silicide. Particular examples include copper, titanium, aluminum, cobalt, ruthenium, titanium nitride, tungsten nitride ($WN_2$), and tantalum nitride, although any suitable material may alternatively be utilized.

In yet another embodiment the layer to be patterned 101 is a dielectric layer with a dielectric constant between about 1 to about 40. In particular examples the dielectric layer for the layer to be patterned 101 may be silicon oxide, silicon nitride, aluminum oxide, hafnium oxide, lanthanum oxide, other suitable low-k dielectric layers, combinations of these, or the like, formed using such processes as deposition, oxidation, or the like.

However, as one of ordinary skill in the art will recognize, while materials, processes, and other details are described in the embodiments, these details are merely intended to be illustrative of embodiments, and are not intended to be limiting in any fashion. Rather, any suitable layer, made of any suitable material, by any suitable process, and any suitable thickness, may alternatively be used. All such layers are fully intended to be included within the scope of the embodiments.

The first hard mask 103 is formed to act as an etch stop layer during etching of the overlying mandrel layer 105 (discussed further below). In some embodiments, the first hard mask 103 also acts as an anti-reflective coating. In an embodiment the first hard mask 103 may be formed from a material such as silicon oxide, such as borophospho silicate tetraethylortho silicate (BPTEOS) or undoped tetraethylorthosilicate (TEOS) oxide, and may be formed by CVD, ALD, spin-on coating, or the like. However, any suitable material and method of formation may be utilized.

The mandrel layer 105 may be a dummy material such as dummy amorphous silicon, dummy polysilicon (DPO), or other material that may be patterned. The mandrel layer 105 may be deposited using a deposition process such as chemical vapor deposition (CVD), physical vapor deposition (PVD), combinations of these, or the like, to a thickness of between about 100 Å and about 5000 Å, such as about 1000 Å. However, any suitable material, method of deposition, or thickness may be utilized.

Once the mandrel layer 105 has been formed, the mandrel layer 105 may be patterned by placing a first photoresist (not separately illustrated in FIG. 1) over the mandrel layer 105. In an embodiment the first photoresist is a tri-layer photoresist, with a bottom anti-reflective coating (BARC) layer, an intermediate mask layer, and a top photoresist layer. However, any suitable type of photosensitive material or combination of materials may be utilized.

Once the first photoresist has been placed over the mandrel layer 105, the first photoresist is patterned. In an embodiment the first photoresist may be patterned by exposing a photosensitive material within the first photoresist (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the first photoresist such that the physical properties of the exposed portions of the first photoresist are different from the physical properties of the unexposed portions of the first photoresist. The first photoresist may then be developed with, e.g., a developer (not separately illustrated), in order to separate the exposed portion of the first photoresist from the unexposed portion of the first photoresist.

Once the mandrel layer 105 has been patterned, the spacer material 107 is conformally formed over the mandrel layer 105. After formation the spacer material 107 extends along top surfaces and sidewalls of the mandrel layer 105, and top surfaces of the first hard mask 103. The spacer material 107 may be formed from titanium oxide (TiO$_x$), AlO, AlN, AlON, TaN, TiN, Si, SiO, SiN, metals, metal alloys, and the like, and may be deposited using any suitable process such as ALD, CVD, or the like. The spacer material 107 may be formed to have a thickness of between about 0.1 nm and about 30 nm, such as about 15 nm. However, any suitable materials, method of manufacture, or thickness may be utilized.

Once in place, first portions of the spacer material 107 in a first portion 113 over the layer to be patterned 101 are covered by a dielectric material 301 (not illustrated in FIG. 1 but illustrated and described below with respect to FIG. 3) while second portions of the spacer material 107 in a second portion 115 over the layer to be patterned 101 are not covered. To prepare for the protection, the bottom layer 109 and the middle layer 111 are deposited onto the spacer material 107. In an embodiment the bottom layer 109 may be a bottom anti-reflective coating (BARC) layer which has different optical properties than a second photoresist 117 that works to prevent the uncontrolled and undesired reflection of energy (e.g., light) such as light back into the overlying second photoresist 117 during an exposure of the second photoresist 117, thereby preventing the reflecting light from causing reactions in an undesired region of the second photoresist 117. For example, the bottom layer 109 may have a different refractive index (n), a different extinction coefficient (k), or thickness (T) value than the second photoresist 117. Additionally, the bottom layer 109 may be used to provide a planar surface, helping to reduce the negative effects of the energy impinging at an angle.

In an embodiment the bottom layer 109 comprises a polymer resin, a catalyst, and a cross-linking agent, all of which are placed into a BARC solvent for dispersal. The polymer resin may comprise a polymer with various monomers bonded together along with a chromophore group. The material for the bottom layer 109 may be applied to the spacer material 107 so that the material for the bottom layer 109 coats an upper exposed surface of the spacer material 107, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the bottom layer 109 may be initially applied such that it has a thickness of between about 10 nm and about 1000 nm, such as about 100 nm.

The middle layer 111 may be placed over the bottom layer 109. In an embodiment the middle layer 111 may be an organic layer or inorganic layer that has a different etch resistance than the second photoresist 117. In a particular embodiment the middle layer 111 is a hard mask material such as silicon, silicon nitride, oxides, oxynitrides, silicon carbide, combinations of these, or the like. The hard mask material for the middle layer 111 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the hard mask material may be utilized, and all such methods or combinations are fully intended to be included within the scope of the embodiments. The middle layer 111 may be formed to a thickness of between about 100 Å and about 800 Å, such as about 300 Å.

The second photoresist 117 is placed over the middle layer 111 in order to provide a patterned mask so that the middle layer 111 can be patterned into the desired pattern. In an embodiment the second photoresist 117 is a photosensitive material that is dispersed onto the middle layer 111 and then exposed to a patterned energy source (e.g., light) in order to induce a chemical reaction in those portions of the photosensitive material that are exposed. This chemical reaction causes a change in physical properties which may be utilized in a development process to separate the exposed portion of the photosensitive material from the unexposed portion of the photosensitive material to create a patterned photoresist.

Once the second photoresist 117 has been patterned into the desired pattern, the second photoresist 117 may be used as a mask to pattern the hard mask material of the middle layer 111. For example, the pattern of the second photoresist 117 may be transferred to the middle layer 111 using a anisotropic etching process such as reactive ion etching (RIE), whereby ions of a suitable etchant such as $CF_4$—$O_2$, may be utilized in a dry etch to remove portions of the middle layer 111 exposed by the patterned second photoresist 117. However, any other suitable etchant, such as $CHF_3/O_2$, $CH_2F_2$, $CH_3F$, or the like, and any other suitable method of removal, such as a wet stripping, may alternatively be used.

Once the pattern of the second photoresist 117 has been transferred to the middle layer 111, the middle layer 111 may be used to transfer the pattern of the second photoresist 117 to the bottom layer 109 to form openings 121 which expose a top surface of the spacer material 107. In an embodiment the bottom layer 109 may be etched using an etching process that utilizes the second photoresist 117 and the middle layer 111 (now patterned) as a masking layer. The etching process may be a dry etch process utilizing an etchant such as oxygen, nitrogen, hydrogen, ammonia, sulfur hexafluoride, difluoromethane, nitrogen trifluoride, chlorine trifluoride, chlorine, carbon monoxide, carbon dioxide, helium, boron dichloride, argon, fluorine, trifluoromethane, tetrafluoromethane, perfluorocyclobutane, perfluoropropane, combinations of these, or the like. However, any other suitable etch process, such as a wet etch, or even a wet etch performed simultaneously with the middle layer 111, and any other suitable etchants may be used.

In a particular embodiment the openings 121 are formed to help locate and position the subsequently deposited dielectric material 301 (discussed further below with respect to FIG. 3). As such, the openings 121 may be formed to have a first width $W_1$ of between about 10 nm and about 100 nm, such as about 64 nm. However, any suitable width may be utilized.

Figure 2:
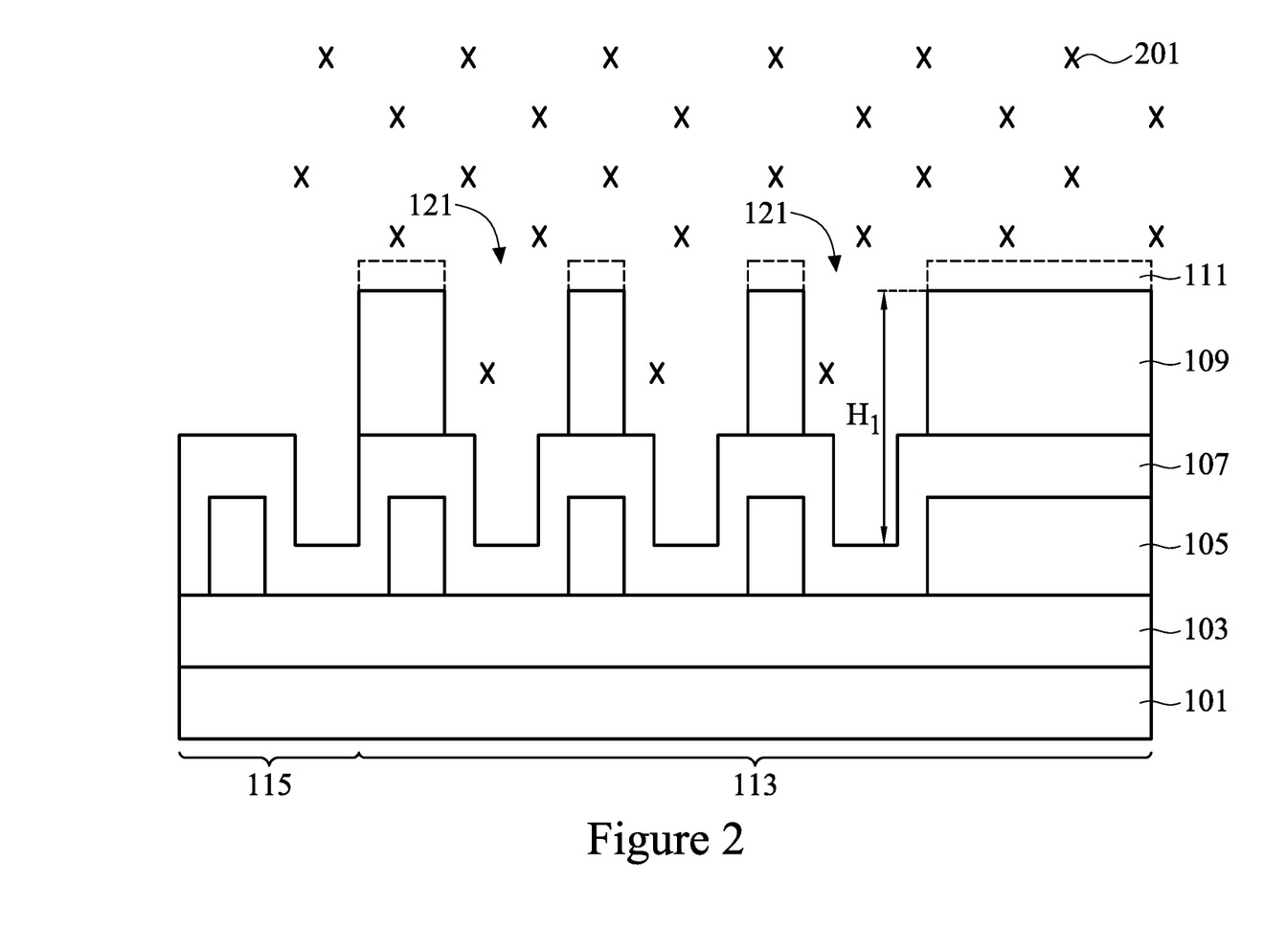
FIG. 2 illustrates a removal of the middle layer, in accordance with some embodiments.

FIG. 2 illustrates that, once either the middle layer 111 or the bottom layer 109 has been patterned, the second photoresist 117 may be removed from the middle layer 111. In an embodiment an ashing process may be utilized in order to remove the second photoresist 117, whereby the temperature of the second photoresist 117 is increased to cause a thermal breakdown of the second photoresist 117, which can then be removed using a cleaning procedure such as a rinse. Alternatively the second photoresist 117 may be removed using, e.g., a wet etching process. Any suitable method for removing the second photoresist 117 may be used, and all such methods are fully intended to be included within the scope of the embodiment.

Additionally, after the second photoresist 117 is removed, an etching process (represented in FIG. 2 by the "X"s labeled 201) is utilized in order to remove the middle layer 111. By removing the middle layer 111 prior to deposition of the dielectric material 301, the height of the openings 121 is reduced. For example, by removing the middle layer 111, the openings 121 may have a first height $H_1$ of between about 30 nm and about 150 nm, such as about 100 nm. However, any suitable height may be utilized.

Additionally, by reducing the height of the openings 121, an aspect ratio of the openings 121, such as a ratio of the first height $H_1$ to the first width $W_1$, is also reduced. For example, in one embodiment the removal of the middle layer 111 modifies the aspect ratio of the openings 121 from being between about 0.4 and about 21 to being between about 0.3 and about 15. With such a reduction in the aspect ratio, it will be easier for a subsequent deposition process (described below with respect to FIG. 3) to fill the openings 121 without formation of voids. Such a reduction in the number of voids makes a manufacturing process easier with fewer defects.

In an embodiment the etching process 201 may be a wet etching process that is utilized to remove the middle layer 111. In a particular embodiment the wet etching process uses a liquid etching solution which is put into physical contact with the exposed portions of the middle layer 111 and wherein components within the middle layer 111 react with the material of the middle layer 111 in order to remove the middle layer 111 from the bottom layer 109. In embodiments the liquid etching solution comprises an etchant, a spacer inhibitor, and a solvent.

Looking first at the etchant portion within the liquid etching solution, the etchant is chosen in order to have a high etch selectively towards the material of the middle layer 111 without substantially removing the remaining exposed materials (e.g., the material of the spacer material 107 and the material of the bottom layer 109). As such, the particular etchant chosen depends at least in part on the materials chosen for the middle layer 111, the bottom layer 109, and the spacer material 107. However, in a particular embodiment in which the middle layer 111 comprises an oxide, the bottom layer 109 comprises an organic material, and the spacer material 107 comprises titanium oxide ($TiO_2$), the etchant chosen may be hydrofluoric acid (HF), tetramethylammonium hydroxide, tetramethylammonium fluoride, combinations of these, or the like. However, any suitable etchant may be utilized.

However, while using an etchant such as hydrofluoric acid is suitable to remove the material of the middle layer 111, the use of hydrofluoric acid also generates significant problems. For example, the liquid etching solution will come into physical contact not only with the exposed portions of the middle layer 111, but will also come into physical contact with each surface of the walls of the openings 121, including the bottom layer 109 and the spacer material 107. As such, if the hydrofluoric acid is left by itself, the hydrofluoric acid will also undesirably react with the material of the spacer material 107, removing the material of the spacer material 107 and generating either undesired topographical variations or else removing so much of the spacer material 107 that a cut fail defect occurs. Such a topographical variation will affect further processing (thereby restricting the process window in order to account for this variation) or else lowering the quality and yield of the devices manufactured with this process because of the cut fail defects.

Accordingly, in order to help prevent the undesirable removal of the spacer material 107, the inhibitor is added in order to inhibit the removal of the spacer material 107 during the etching process 201. In an embodiment the inhibitor is a chelator that may be placed within the liquid etching solution and is used to increase the etch selectively of the etching solution such that the material of the spacer material 107 is removed at a lesser rate. As such, the inhibitor is dependent at least in part on the material of the spacer material 107, the middle layer 111, and the remaining components of the liquid etching solution. However, in an embodiment in which the spacer material 107 is titanium oxide, the middle layer 111 comprises an oxide, and the etchant is hydrofluoric acid, the inhibitor may comprise an N-ethanolamide derivative ligand. In a particular embodiment the inhibitor may have the following structure:

Wherein R1 is an organic group such as an alkyl group, an ester group, an aromatic group, a ketone group, an amide group or a carboxylic acid group, and wherein R2 is an organic group such as an alkyl group, an ester group, an aromatic group, a ketone group, an amide group or a carboxylic acid group, and wherein R1 and R2, in some embodiments, can bond together to form a cycloalkane.

In particular embodiments the inhibitor may be 1-(2-hydroxyethyl)-2-pyrrolidinone, N,N-diethanololeamide, N-hydroxyethylphthalimide, 1-(2-hydroxyethyl)pyrrolidine-2,5-dione, N-(2-hydroxyethyl)-1,2,3,6-tetrahydrophthalimide, which may respectively have the following structures:

The solvent of the liquid etching solution is used to buffer and dilute the etchant so that the etching rate of the etchant is in a controllable range. Additionally, the solvent also allows for a method of dispensing the etchant and contracting the etchant to the middle layer 111. As such, the solvent may be any suitable liquid allows for the dispersal and control of the etchant and the inhibitor. In a particular, embodiment the solvent may be water, although any other suitable liquids, such as glycols or alcohols, may also be utilized.

To prepare the liquid etching solution, the etchant and the inhibitor are placed into the solvent and mixed, either separately or at the same time. In another embodiment, the etchant and the solvent may be obtained together (e.g., as diluted hydrofluoric acid) and the inhibitor may be added to the solution. Any suitable method of mixing each of the components to obtain the liquid etching solution may be utilized.

In an embodiment the etchant may be placed into the solvent at a concentration of between about 0.01%-wt and about 50%-wt, such as about 5%-wt. Additionally, the inhibitor may be placed within the solvent at a concentration of between about 0.001%-wt and about 5%-wt, such as about 0.01%-wt. However, any suitable concentrations may be utilized.

In a particular embodiment the etching solution may comprise a combination of tetramethylammonium hydroxide (at about 0.5%-wt) and tetramethylammonium fluoride (at about 1.5%-wt). These may be placed within ethylene glycol (at about 10%-wt to about 15%-wt). Finally, the inhibitor, such as the n-ethanolamide derivative, is placed at a concentration of about 1%-wt or less.

Once the etching solution has been prepared, the etching solution may be placed into physical contact with the middle layer 111. In an embodiment the etching process 201 may be performed by dipping the structure comprising the middle layer 111 and the spacer material 107 into a pool of the etching solution in a dip method. However, any other suitable process of contacting the etching solution with the middle layer 111, such as puddle processes, spray-on processes, combinations of these, or the like, may be utilized.

In an embodiment the etching process 201 may be performed at a temperature of between about 20° C. and about 80° C., such as about 40° C. Additionally, in order to remove the middle layer 111, the etching process 201 may be performed for a time of less than about 15 minutes, such as about 4 minutes. However, any suitable temperature and time may be utilized.

By utilizing the inhibitor, the middle layer 111 may be removed without excessive damage being caused to the spacer material 107. For example, in an embodiment in which the inhibitor is at a concentration of 10 wt % and the ratio of hydrofluoric acid and water is 1:100, the etch rate of the spacer material 107 when the spacer material 107 is titanium oxide can be reduced from greater than 13.75 Å/minute to an etch rate of about 4.2 Å/min. As such, for an etching time of four minutes at room temperature, the loss of material from the spacer material 107 may be reduced from greater than 55 Å (or even 110 Å) to about 16.81 Å.

As another example, the concentration of the inhibitor may be raised to be about 40%. In this example, the etch rate of the spacer material 107 may be reduced even further to an etch rate of 2.29 Å/min. Under this example, the thickness loss of the spacer material 107 (e.g., titanium oxide) is reduced to about 9.13 Å.

In another embodiment the ratio of hydrofluoric acid and water may be about 1:500. Without the presence of the inhibitor, the etching process may have an etch rate of the spacer material 107 of about 2.28 Å/min. For an etching time of four minutes at room temperature, the amount of spacer material 107 lost may be about 9.12 Å for a four minute etch and about 40.43 Å for a fifteen minute etch. However, if the inhibitor is introduced at a concentration of about 10%, the etch rate of the titanium oxide can be reduced to 1.4 Å/min. This results in a reduction of the loss of spacer material 107 to be about 5.61 Å.

As another example, the concentration of the inhibitor may be raised to be about 40%. In this example, the etch rate of the spacer material 107 may be reduced even further to an etch rate of 0.39 Å/min. Under this example, the thickness loss of the spacer material 107 (e.g., titanium oxide) for a time etch of about four minutes is reduced to about 1.54 Å.

Without being bound by a particular theory, it is believed that the inhibitor will react and bond with exposed atoms of the spacer material 107, thereby preventing the exposed atoms from being available for reaction with the etchant. In an embodiment in which the spacer material 107 is titanium oxide and the inhibitor is as described above, it is believed that the lone pair of oxygens within the inhibitor reacts as an electron acceptor with the titanium atoms, either with a single titanium atom or multiple titanium atoms, in order to form a titanium-cyclic intermediate, such as illustrated below:

For example, in one theory of a particular embodiment the titanium can react with the lone pair of oxygen as an electron acceptor to form a titanium-cyclic intermediate. Such an intermediate allows the N-ethanolamide derivative to sear as the titanium protector.

Figure 3:
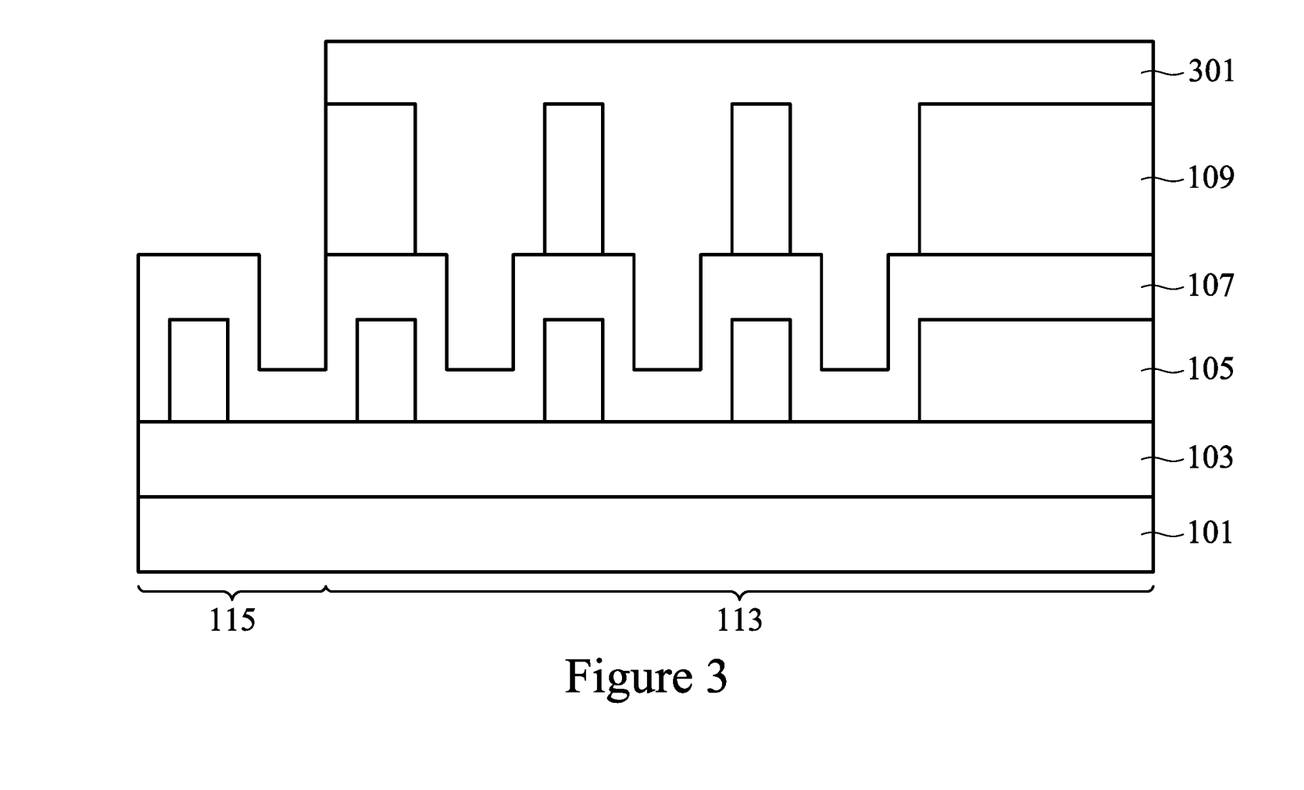
FIG. 3 illustrates a deposition of a masking layer, in accordance with some embodiments.

In a particular embodiment in which the spacer material 107 is titanium oxide and the inhibitor is 1-(2-hydroxyethyl)-2-pyrrolidinone, it is believed that the inhibitor chelates with the titanium, either with a single titanium atom or multiple titanium atoms, such as illustrated below:

FIG. 3 illustrates that, once the middle layer 111 has been removed and the aspect ratio of the openings 121 has been reduced, the spacer material 107 located over the first portion 113 of the layer to be patterned 101 may be protected by covering or masking the spacer material 107 in the first portion 113 of the layer to be patterned 101 with the dielectric material 301. In an embodiment the dielectric material 301 may be a material such as a low temperature silicon oxide, although any suitable dielectric material may be utilized. However, other suitable materials, such as oxides and nitrides, may be utilized.

In an embodiment the dielectric material 301 may be deposited using a deposition process such as atomic layer deposition (ALD). For example, in an embodiment the remaining structure including the spacer material 107 and the bottom layer 109 may be exposed to a first precursor which reacts with the exposed surfaces of the spacer material 107 and the bottom layer 109 in a self-limiting reaction. After the first precursor is removed, the surface is exposed to a second precursor which reacts with the products of the first precursor in another self-limiting reaction and finishing a first cycle to form a first monolayer of the dielectric material 301 (individual monolayers not separately illustrated in FIG. 3). The first cycle may then be repeated (e.g., the first monolayer may be exposed to a first precursor and then subsequently exposed to a second precursor) in order to form a second monolayer over the first monolayer and increase the overall thickness of the dielectric material 301. The atomic layer process of cycles can be continually repeated until the thickness of the dielectric material 301 is large enough to fill and overfill the openings 121, such as a thickness of between about 50 Å and about 2000 Å, such as about 500 Å. However, any suitable thickness may be utilized.

In a particular embodiment the dielectric material 301 may be an oxide such as a low temperature oxide. In such an embodiment the first precursor may be a precursor such as silanes while the second precursor may be a oxidizing precursor, such as water, oxygen or oxygen-containing plasma. However, while these precursors are described, any suitable precursor materials may be utilized.

By removing the middle layer 111 prior to the deposition of the dielectric material 301, the aspect ratio of the openings 121 has also been reduced prior to the deposition of the dielectric material 301. As such, problems that arise from attempting to deposit materials into high aspect ratio openings (e.g., the formation of voids within the deposited material) may be reduced or eliminated. Additionally, by adding the inhibitor within the liquid etching solution, the negative effects of etching the spacer material 107 during the removal of the middle layer 111 may be reduced or eliminated FIG. 3 also illustrates a patterning of the dielectric material 301 to expose the spacer material 107 over the second portion 115 of the layer to be patterned 101. In an embodiment a third photoresist (not separately illustrated) is placed over the dielectric material 301 and patterned to expose that portion of the spacer material 107 in the second portion 115. Once the third photoresist has been patterned, the dielectric material 301 may be removed using, e.g., an anisotropic etching process such as a reactive ion etch, and the third photoresist may be removed using, e.g., an ashing process. However, any suitable etching process may be used to expose the spacer material 107 over the second portion 115 of the layer to be patterned 101.

Figure 4:
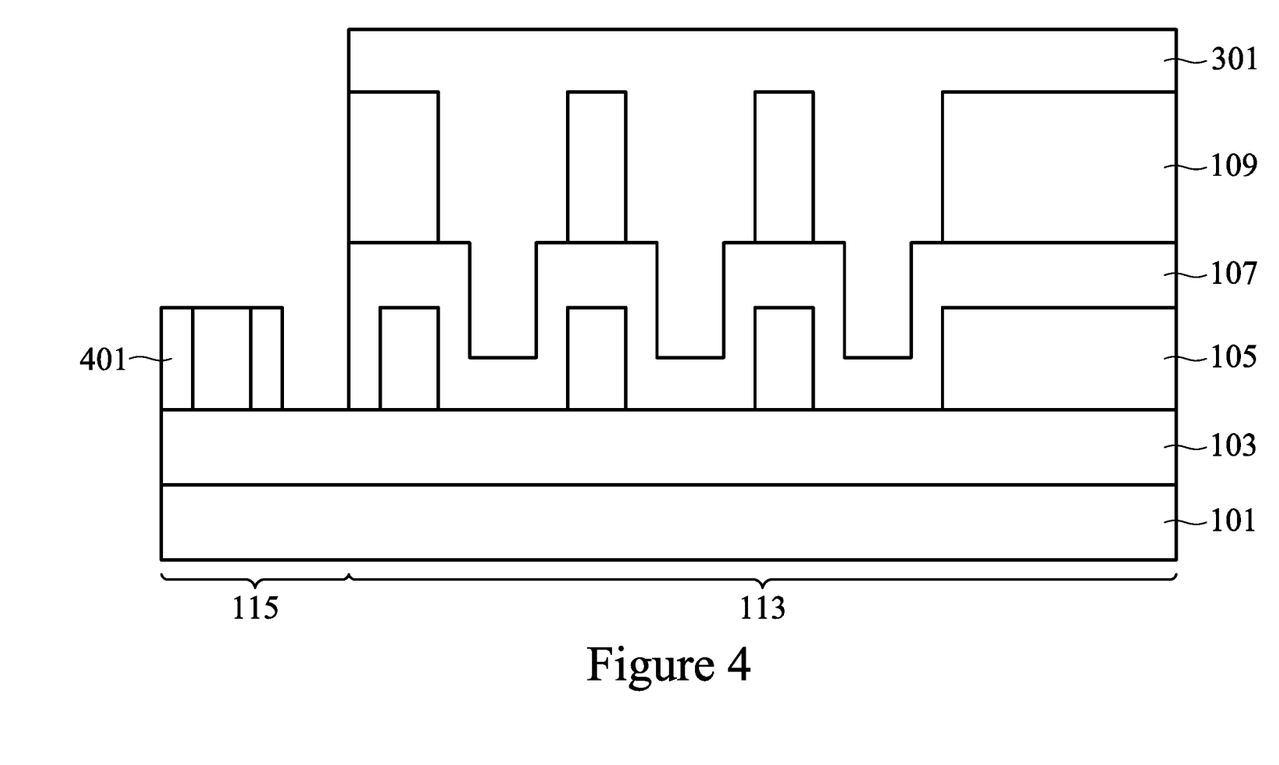
FIG. 4 illustrates a formation of spacers, in accordance with some embodiments.

FIG. 4 illustrates a formation of spacers 401 from the spacer material 107 over the second portion 115 of the layer to be patterned 101. In an embodiment the spacers 401 are formed from the spacer material 107 by anisotropically etching and removing the spacer material 107 from the horizontal surfaces of the mandrel layer 105. However, any suitable processes may be utilized.

Figure 5:
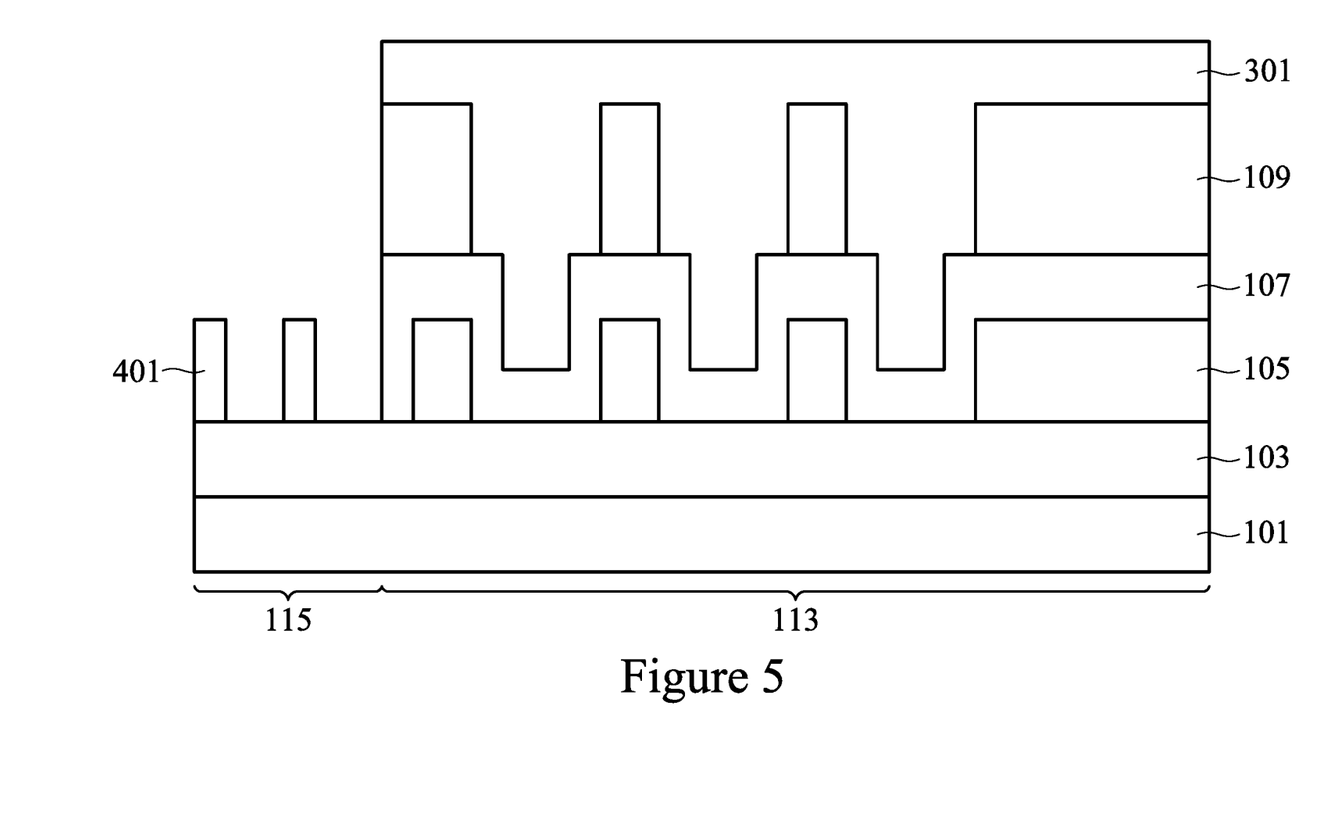
FIG. 5 illustrates a removal of a mandrel material from between the spacers, in accordance with some embodiments.

FIG. 5 illustrates that once the spacers 401 are formed, the mandrel layer 105 may be removed from between the spacers 401. In an embodiment the mandrel layer 105 may be removed using a wet etch, although any suitable etching technique, such as a dry etch, may alternatively be utilized. For example, if silicon is utilized to form the mandrel layer 105, then an etchant such as HF may be utilized to remove the mandrel layer 105 without significantly removing any of the spacers 401. By using the mandrel layer 105 to form the spacers 401 and then removing the mandrel layer 105, a mask with smaller dimensions than the mandrel layer 105 (which may be limited by the lithography process utilized) may be obtained.

Figure 6:
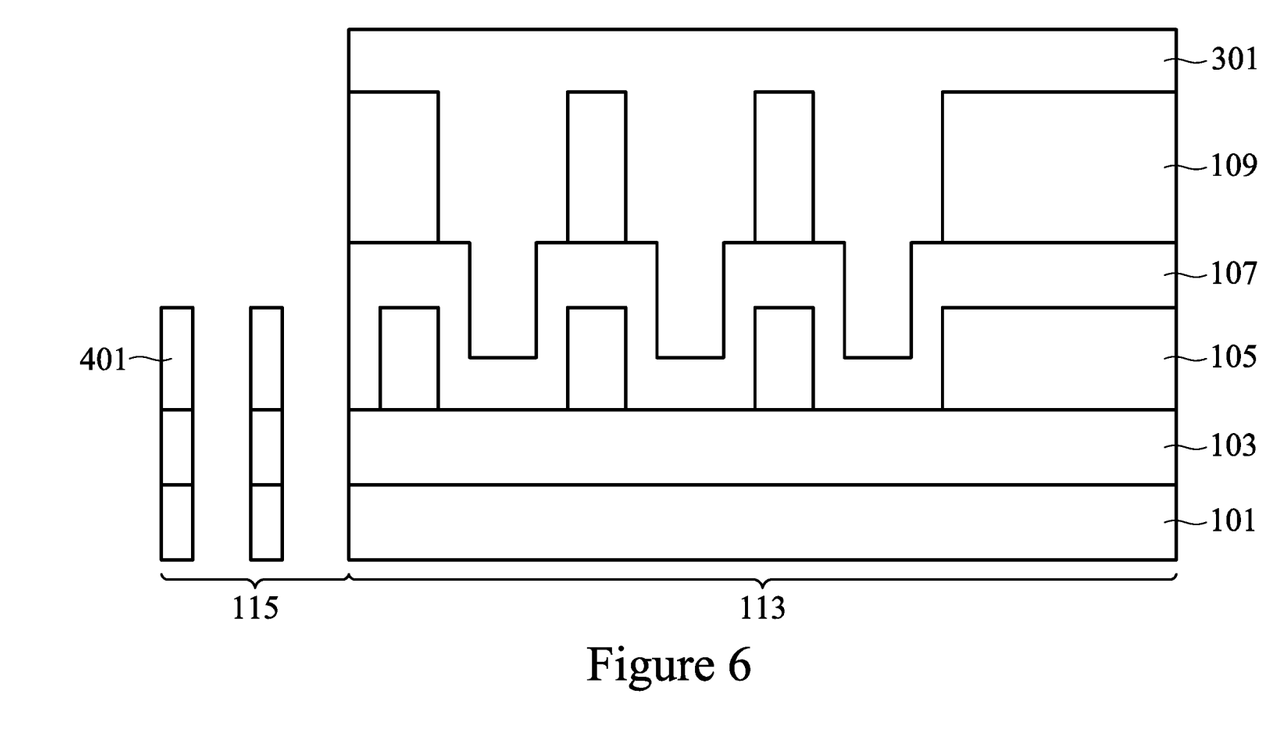
FIG. 6 illustrates a patterning of a layer to be patterned, in accordance with some embodiments.

FIG. 6 illustrates that, once the spacers 401 have been formed and the mandrels layer 105 has been removed from between the spacers 401, the pattern of the spacers 401 may be transferred to the underlying first hard mask 103 and the underlying layer to be patterned 101. In an embodiment the pattern of the spacers 401 may be transferred using one or more an anisotropic etching processes such as reactive ion etches. However, any suitable process may be utilized to transfer the pattern of the spacers 401 into the underlying layers.

By including the inhibitor within the liquid etching solution, the middle layer 111 may be removed in order to reduce the aspect ratio of the openings 121. As such, a potential negative effect of using an atomic layer deposition process to deposit a material such as low temperature oxide (e.g., voids) can be better avoided. As such, manufactures can take advantage of the other benefits of different materials, such as low temperature oxide's reduced topographic loadings, low temperatures oxide's selectivity to titanium oxide (e.g., 0.78), or low temperature oxide's tunable critical dimension control. Such benefits allow for a reduced cut failure rate due to RM quality or topographical loading issues.

In an embodiment, a method of manufacturing a semiconductor device includes patterning a middle layer to expose a spacer material and applying an etchant to be in physical contact with both the middle layer and the spacer material, wherein the etchant comprises an inhibitor which inhibits an etch rate of the spacer material. In an embodiment the etchant comprises dilute hydrofluoric acid. In an embodiment the spacer material is titanium oxide. In an embodiment the inhibitor comprises an N-ethanolamide derivative ligand. In an embodiment the inhibitor is a chelator. In an embodiment the method further includes depositing a dielectric material over the spacer material. In an embodiment the depositing the dielectric material is performed at least in part using an atomic layer deposition process.

In an embodiment, a method of manufacturing a semiconductor device includes depositing a spacer material over a mandrel; placing a tri-layer photoresist over the spacer material, the tri-layer photoresist including: a bottom layer; a middle layer; and a photoresist; patterning the middle layer and the bottom layer to form a first opening and expose the spacer material; removing the middle layer with an etching solution, the etching solution comprising an inhibitor to lower an etch rate of the spacer material during the removing the middle layer; filling the first opening with a masking material. In an embodiment, the method includes filling the first opening using at least in part an atomic layer deposition process. In an embodiment, the filling the first opening comprises filling the first opening with a dielectric material. In an embodiment, the dielectric material is free from voids. In an embodiment, the dielectric material is an oxide. In an embodiment, the dielectric material is a low temperature oxide. In an embodiment, the inhibitor has a concentration of between about 10% and about 40%.

A method of manufacturing a semiconductor device includes: patterning a middle layer and a bottom layer to expose a layer of titanium oxide; applying an etchant to remove the middle layer; and lowering an etching rate of the layer of titanium oxide by simultaneously applying an inhibitor to the layer of titanium oxide, wherein the inhibitor comprises an N-ethanolamide derivative ligand. In an embodiment, the inhibitor is 1-(2-hydroxyethyl)-2-pyrrolidinone. In an embodiment, the inhibitor is N,N-diethanololeamide. In an embodiment, the inhibitor is N-hydroxyethylphthalimide. In an embodiment, the inhibitor is 1-(2-hydroxyethyl)pyrrolidine-2,5-dione. In an embodiment, the inhibitor is N-(2-hydroxyethyl)-1,2,3,6-tetrahydrophthalimide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
forming a mandrel over a semiconductor substrate;
depositing a spacer material over the mandrel;
placing a bottom layer over the spacer material, wherein the bottom layer comprises a bottom anti-reflective layer;
placing a middle layer over the bottom layer;
patterning the middle layer and the bottom layer to expose the spacer material; and
applying an etching solution to both the middle layer and the spacer material, wherein a first component of the etching solution removes the middle layer and a second component of the etching solution reacts with a surface of the spacer material to protect the surface of the spacer material from the first component, the etching solution comprising 1-(2-hydroxyethyl)pyrrolidine-2,5-dione.

2. The method of claim 1, wherein the spacer material comprises titanium oxide.

3. The method of claim 1, wherein the etching solution has a concentration of the second component of between about 0.001%-wt and about 5%-wt.

4. The method of claim 1, wherein the etching solution comprises hydrofluoric acid.

5. The method of claim 4, wherein the second component comprises an N-ethanolamide derivative ligand.

6. The method of claim 5, wherein the etching solution has a concentration of the hydrofluoric acid of between about 0.01%-wt and about 50%-wt.

7. The method of claim 6, wherein the etching solution has a concentration of the hydrofluoric acid of between about 0.01%-wt and about 5%-wt.

8. A method of manufacturing a semiconductor device, the method comprising:
depositing a bottom anti-reflective layer over a spacer material over a mandrel layer, the spacer material in physical contact with the mandrel layer;
depositing a middle layer over the bottom anti-reflective layer;
patterning the bottom anti-reflective layer to expose at least a portion of the spacer material; and
removing the middle layer with a first etchant, the first etchant comprising:
an etching component; and
an inhibitor component to protect the spacer material, wherein the inhibitor component comprises N-(2-hydroxyethyl)-1,2,3,6-tetrahydrophthalimide.

9. The method of claim 8, wherein the inhibitor component comprises an N-ethanolamide derivative ligand.

10. The method of claim 9, wherein the etching component comprises tetramethylammonium hydroxide.

11. The method of claim 10, wherein the first etchant further comprises ethylene glycol.

12. The method of claim 11, wherein the first etchant has a concentration of ethylene glycol of between about 10%-wt and about 15%-wt.

13. A method of manufacturing a semiconductor device, the method comprising:

forming an opening through a bottom anti-reflective layer to expose a spacer material over a mandrel layer, the opening having a first aspect ratio, wherein the spacer material extends into a region between a first portion of the mandrel layer and a second portion of the mandrel layer;

reducing the first aspect ratio to a second aspect ratio by applying a first etchant, the first etchant removing material of the spacer material at a rate of no greater than about 4.2 Å/min; and depositing a dielectric material into the opening with the second aspect ratio.

14. The method of claim 13, wherein the first etchant removes a material of the spacer material at a rate of no greater than about 2.29 Å/min.

15. The method of claim 13, wherein the first etchant removes a material of the spacer material at a rate of no greater than about 1.4 Å/min.

16. The method of claim 13, wherein the first etchant removes a material of the spacer material at a rate of no greater than about 0.39 Å/min.

17. The method of claim 13, wherein the dielectric material is free from voids.

18. The method of claim 13, wherein the first etchant comprises 1-(2-hydroxyethyl)pyrrolidine-2,5-dione.

19. The method of claim 13, wherein the first etchant comprises N-(2-hydroxyethyl)-1,2,3,6-tetrahydrophthalimide.

20. The method of claim 13, wherein the first etchant comprises hydrofluoric acid.

* * * * *